US008030247B2

(12) United States Patent
Yoo et al.

(10) Patent No.: US 8,030,247 B2
(45) Date of Patent: Oct. 4, 2011

(54) SYNTHESIZING PRECURSOR SOLUTION ENABLING FABRICATING BIAXIALLY TEXTURED BUFFER LAYERS BY LOW TEMPERATURE ANNEALING

(75) Inventors: Jai-Moo Yoo, Kyungsangnam-do (KR); Young-Kuk Kim, Kyungsangnam-do (KR); Jae-Woong Ko, Kyungsangnam-do (KR); Kook-Chae Chung, Kyungsangnam-do (KR)

(73) Assignee: Korea Institute of Machinery & Materials, Daejeon (KR)

( * ) Notice: Subject to any disclaimer, the term of this patent is extended or adjusted under 35 U.S.C. 154(b) by 175 days.

(21) Appl. No.: 12/312,880

(22) PCT Filed: Jan. 12, 2007

(86) PCT No.: PCT/KR2007/000231
§ 371 (c)(1),
(2), (4) Date: May 28, 2009

(87) PCT Pub. No.: WO2008/078852
PCT Pub. Date: Jul. 3, 2008

(65) Prior Publication Data
US 2009/0302282 A1  Dec. 10, 2009

(30) Foreign Application Priority Data
Dec. 22, 2006 (KR) .................. 10-2006-0132499

(51) Int. Cl.
*H01L 39/24* (2006.01)
*H01B 1/20* (2006.01)
*B05D 5/12* (2006.01)

(52) U.S. Cl. ..... 505/238; 505/237; 505/239; 252/519.3; 427/62

(58) Field of Classification Search .............. 505/238, 505/237, 239; 252/519.3; 427/62
See application file for complete search history.

(56) References Cited

U.S. PATENT DOCUMENTS

| 5,958,599 A * | 9/1999 | Goyal et al. ............. 428/457 |
| 6,156,376 A | 12/2000 | Paranthaman et al. |
| 6,235,402 B1 * | 5/2001 | Shoup et al. ............. 428/472 |
| 6,436,317 B1 | 8/2002 | Malozemoff et al. |
| 6,537,689 B2 | 3/2003 | Schoop et al. |
| 6,555,256 B1 * | 4/2003 | Christen et al. ............ 428/697 |
| 6,673,387 B1 * | 1/2004 | Zhang et al. ................ 427/62 |
| 6,765,151 B2 * | 7/2004 | Fritzemeier et al. ....... 174/125.1 |
| 6,800,591 B2 * | 10/2004 | Jia et al. .................. 505/237 |
| 6,821,338 B2 * | 11/2004 | Reade et al. .................. 117/4 |
| 6,828,507 B1 * | 12/2004 | Fritzemeier et al. ....... 174/125.1 |
| 6,893,732 B1 | 5/2005 | Fritzemeier et al. |
| 6,974,501 B1 * | 12/2005 | Zhang et al. ................. 117/84 |

FOREIGN PATENT DOCUMENTS
WO   WO0235615   5/2002

OTHER PUBLICATIONS

Shoup et al., "Epitaxial Thin Film Growth of Lanthanum and Neodymium Aluminate Films on Roll-textured Nickel Using a Sol-Gel Method", J. Am. Ceram. Soc., 81(11)(1998), 3019-3021.*

* cited by examiner

*Primary Examiner* — Douglas McGinty
(74) *Attorney, Agent, or Firm* — Cooper & Dunham LLP

(57) ABSTRACT

Disclosed herein is a precursor solution for forming a biaxially oriented buffer layer through low-temperature heat treatment, by which a highly oriented buffer layer can be formed even when the precursor solution is heat-treated at a low temperature of 1000° C. or lower at the time of forming a buffer layer through a wet chemical method. The precursor solution is prepared by adding a carboxylate or an alkoxide of bismuth, boron, lead, gallium, or the like, which is a metal salt for forming an oxide having a low melting point of 1200° C. or lower after pyrolysis in an oxygen atmosphere, to a precursor solution for forming a buffer layer through a wet chemical method.

3 Claims, 4 Drawing Sheets

[Fig. 1]
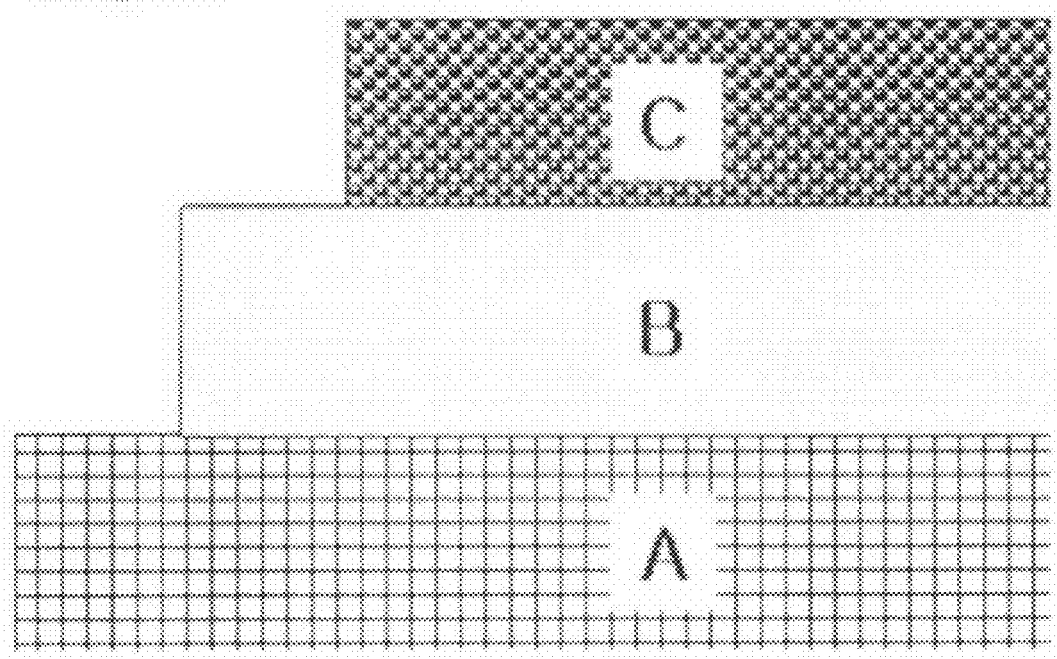

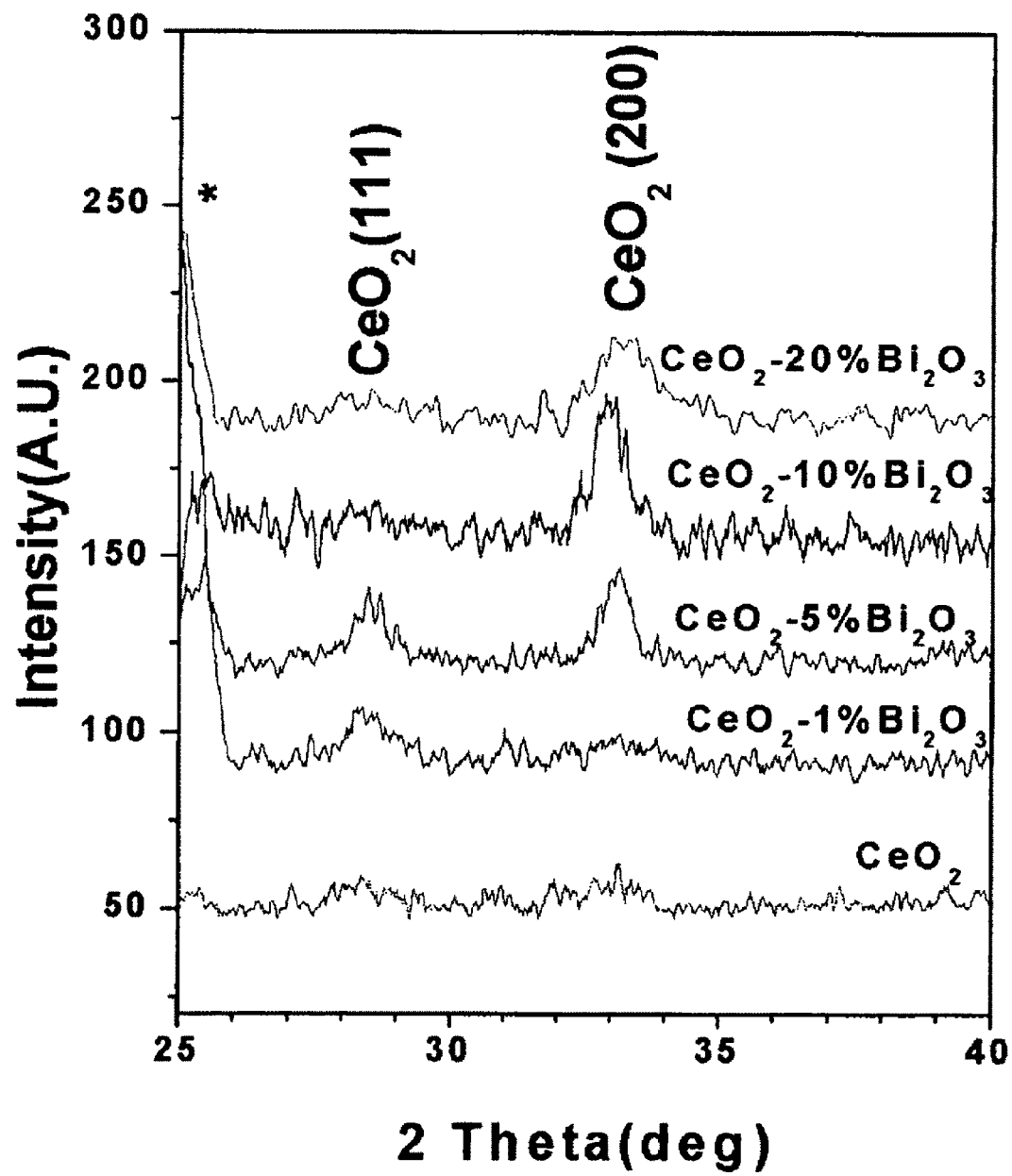
[Fig. 2]

[Fig. 3]
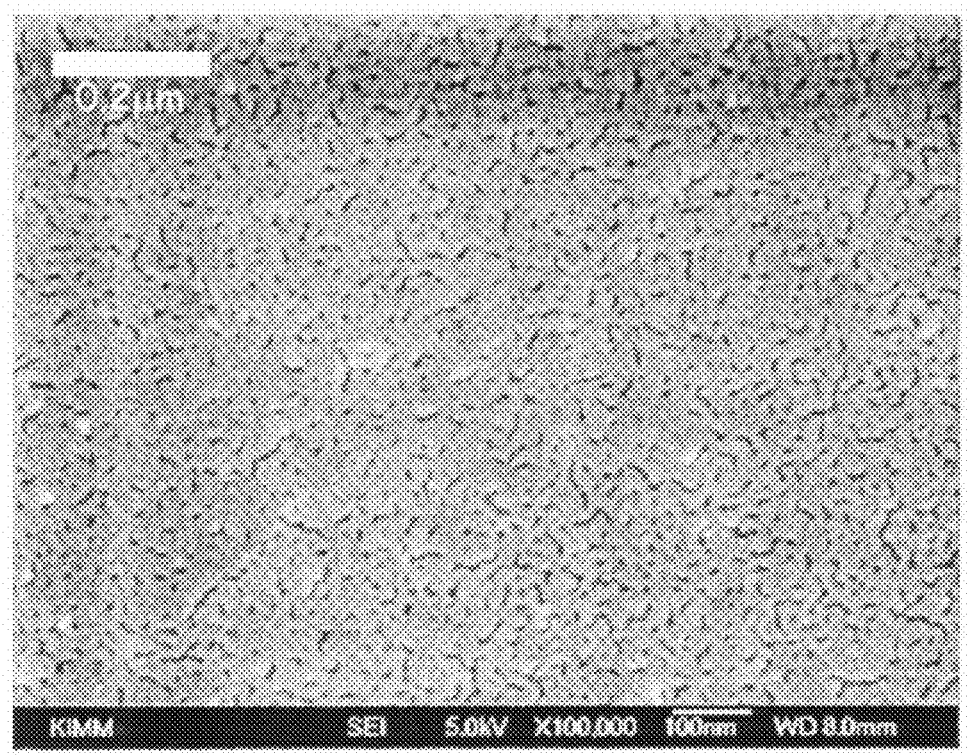
[Fig. 4]
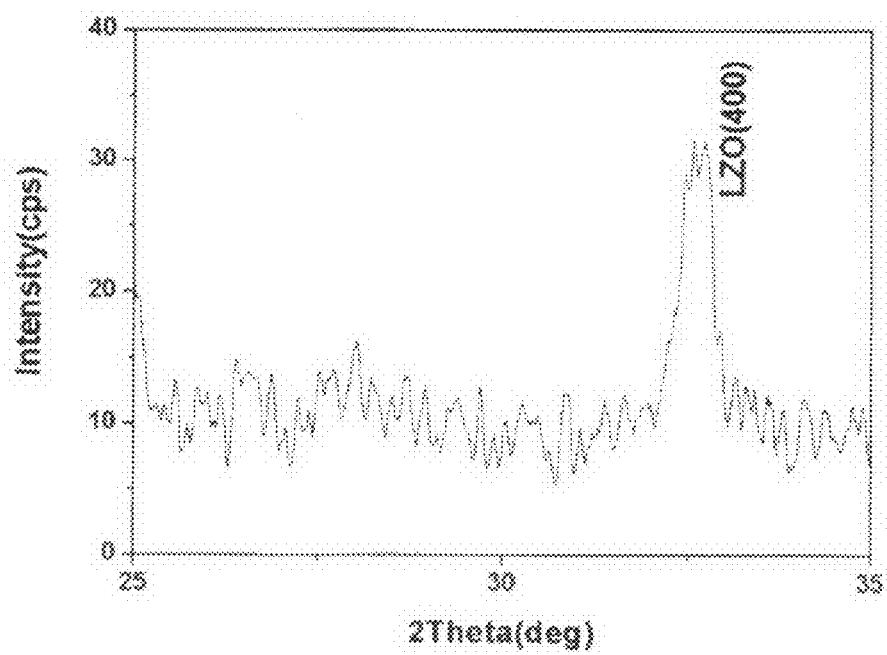

[Fig. 5]
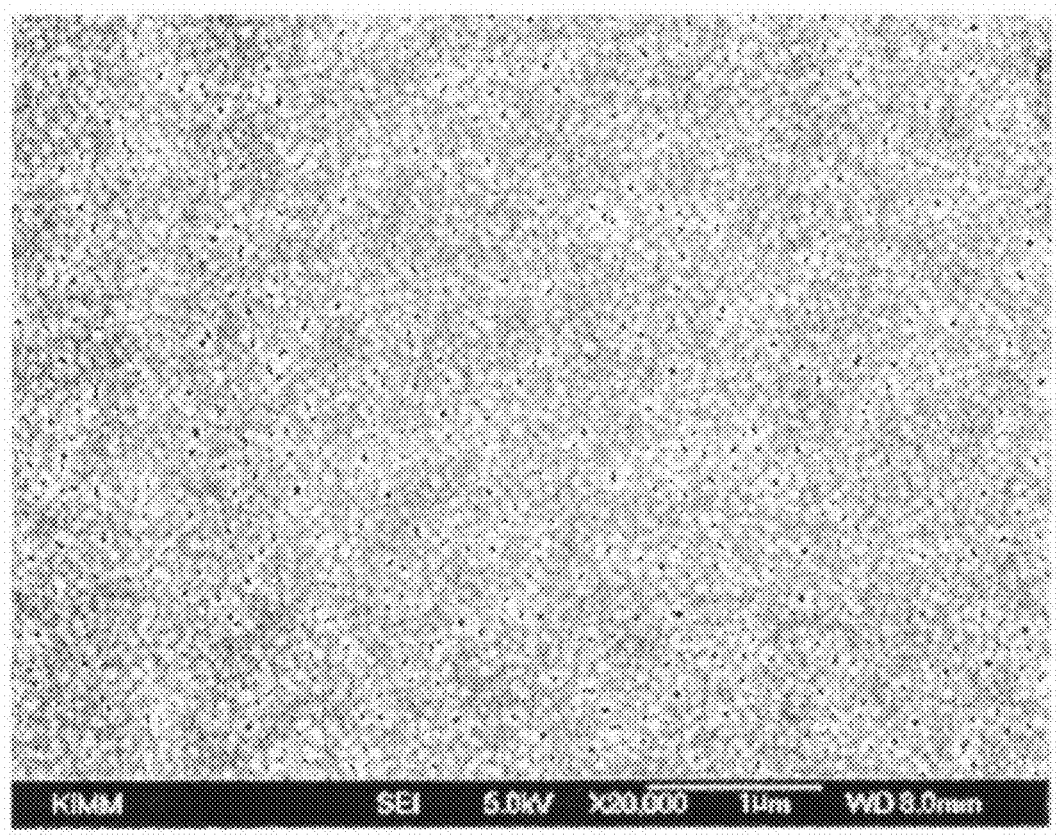

SYNTHESIZING PRECURSOR SOLUTION ENABLING FABRICATING BIAXIALLY TEXTURED BUFFER LAYERS BY LOW TEMPERATURE ANNEALING

TECHNICAL FIELD

The present invention relates to a precursor solution for forming a buffer layer of a superconducting wire rod, and, more particularly, to a precursor solution for forming a biaxially oriented buffer layer through low-temperature heat treatment, by which a buffer layer having a high degree of orientation can be formed even when the precursor solution is heat-treated at a low temperature of 1000° C. or lower.

BACKGROUND ART

Generally, an oxide superconducting wire rod, represented by $YBa_2Cu_3O_{7-x}$, has high current transport capacity and excellent critical current characteristics in high magnetic fields. Therefore, it is expected that such an oxide superconducting wire rod will enable large-capacity power equipment to have a small size, high efficiency and large capacity when it is applied to power cables, industrial motors, generators, and the like in the future. The oxide superconducting wire rod, as shown in FIG. 1, includes a metal substrate A, a buffer layer B and a superconducting layer C, and the current transport characteristics thereof change greatly depending on the orientation of superconductor grains. Therefore, in order to manufacture a superconducting wire rod having a high critical current density (Jc), superconductor grains must be highly biaxially oriented. In particular, a buffer layer, serving to transmit the orientation of a metal substrate to a superconducting layer and to suppress the reaction between a metal substrate and a superconducting layer, plays an important role in the manufacture of a superconducting wire rod, and the cost of preparing the buffer layer accounts for most of the total cost of manufacturing the superconducting wire rod. Therefore, in order to impart functionality to the buffer layer, the buffer layer must be grown on the metal substrate while being biaxially oriented thereon, and, in order to suppress the reaction between the metal substrate and the superconducting layer, the buffer layer must have high density or be thick. Further, the properties of the metal substrate must not be deteriorated during the process of forming the buffer layer on the metal substrate. In order to accomplish the above object, various materials, such as $CeO_2$, YSZ, $Y_2O_3$, $RE_2Zr_2O_7$ (RE=La, Sm, Ce, etc.), $SrTiO_3$, and the like, are currently used to form the buffer layer.

Currently, in order to form a buffer layer on a metal substrate produced through a process of manufacturing an oxide superconducting wire rod, high-vacuum methods, such as sputtering, pulsed laser deposition (PLD), thermal evaporation, metal organic chemical vapor deposition (MOCVD), etc., or wet chemical methods, such as metal organic deposition (MOD), etc., are used.

The high-vacuum methods are disadvantageous in that, since they must be performed in a high vacuum, that is, at a low pressure of 10~5 Pa, expensive high-vacuum systems and advanced high-vacuum technologies are required, thus decreasing process stability and economic efficiency, which are prerequisites to the practical use of the superconducting wire rod. In contrast, the wet chemical methods, such as metal organic deposition (MOD), etc., are economically advantageous in that they need not be performed in a high vacuum, and include simple processes, for example, coating and heat-treatment.

However, when a buffer layer is formed through metal organic deposition (MOD), a highly oriented and densified buffer layer can be formed only when heat-treatment is conducted at 1000° C. or higher, generally at 1100° C. Therefore, the wet chemical methods are also problematic in that the crystal grain boundaries of a metal substrate are transformed, and thus grooves are formed in the surface thereof. The grooves, formed along the crystal grain boundaries of the metal substrate, worsen the connection between superconducting crystal grains, thus deteriorating the critical current characteristics of a superconducting layer, at the time of forming a superconducting layer. In particular, the grooves become an obstacle to a process of extending a superconducting wire rod, which is necessary for practical application of the superconducting wire rod.

When such problems, occurring in the process of forming a buffer layer, are overcome, and simultaneously, a highly oriented and densified superconducting layer is formed at low cost, the productivity of an oxide superconducting wire rod is maximized, thus having far-reaching effects on the practical use of the oxide superconducting wire rod.

Therefore, in order to overcome the above problems, methods of forming a buffer layer, which can form a highly oriented buffer layer even when it is heat-treated at a low temperature of 1000° C. or lower, are required.

DISCLOSURE OF THE INVENTION

Technical Tasks to be Solved by the Invention

Accordingly, the present invention has been made keeping in mind the above problems occurring in the prior art, and an object of the present invention is to provide a precursor solution for forming a biaxially oriented buffer layer through low-temperature heat treatment, by which, even when the precursor solution is heat-treated at a low temperature of 1000° C. or lower at the time of forming a buffer layer through the wet chemical methods, the precursor solution can be epitaxially grown on a biaxially oriented metal substrate without worsening the characteristics of the substrate, thus enabling a final buffer layer to have biaxially oriented crystallinity and a densified microstructure.

Technical Solution

The above object can be accomplished by adding a carboxylate or an alkoxide of bismuth, boron, lead, gallium, or the like, which is a metal salt for forming an oxide having a low melting point of 1200° C. or lower after pyrolysis in an oxygen atmosphere, to a precursor solution for forming a buffer layer, such as YSZ, $CeO_2$, $RE_2O_3$ (RE=Y, Ce, Sm, Gd, Eu ... etc.), $RE_2M_2O_7$ (RE=Y, Ce, Sm, Gd, Eu ... etc., M=Zr, Ti, Sn, ... ), $AMO_3$ (A=Sr, Ba, Ca, M=Zr, Ti, Sn, ... ) or the like, through a wet chemical method.

In order to accomplish the above object, the present invention provides a precursor solution for forming a biaxially oriented buffer layer through low-temperature heat treatment, which is prepared by mixing a precursor for forming a buffer layer, such as YSZ, $CeO_2$, $RE_2O_3$ (RE=Y, Ce, Sm, Gd, Eu ... etc.), $RE_2M_2O_7$ (RE=Y, Ce, Sm, Gd, Eu ... etc., M=Zr, Ti, Sn, ... ), $AMO_3$ (A=Sr, Ba, Ca, M=Zr, Ti, Sn, ... ) or the like, with a solvent selected from the group consisting of alcohol liquids, ester liquids, ketones and mixtures thereof to form a precursor solution and then adding a metal salt (carboxylate or alkoxide), serving as a precursor for forming a low melting point oxide, to the precursor solution.

The precursor for forming a buffer layer, such as YSZ, $CeO_2$, $RE_2O_3$ (RE=Y, Ce, Sm, Gd, Eu . . . etc.), $RE_2M_2O_7$ (RE=Y, Ce, Sm, Gd, Eu . . . etc., M=Zr, Ti, Sn, . . . ), $AMO_3$ (A=Sr, Ba, Ca, M=Zr, Ti, Sn, . . . ) or the like, may be a carboxylate or an alkoxide of yttrium, cerium, rare-earth elements (RE=Y, Ce, Sm, Gd, Eu . . . etc.), transition metal elements (M=Zr, Ti, Sn, . . . ), alkaline earth metals (Sr, Ba, Ca . . . etc.), or the like.

In the solvent, the alcohol liquid may include at least one of water, methanol and ethanol, the ester liquid may include at least one of ethyl acetate and ethyl butyrate, and the ketone may include at least one of acetone and propanone.

The concentration of precursors constituting the precursor solution may range from 0.01 to 1 M, and preferably from 0.1 to 0.6 M.

The precursor for forming a low melting point oxide includes at least one metal salt selected from among bismuth (Bi), boron (B), lead (Pb), gallium (Ga), lithium (Li), sodium (Na), potassium (K), and cesium (Cs).

The amount of the precursor for forming a low melting point oxide is 0.1%~30% by mol, and, preferably, 5%~10% by mol of the total amount of metal elements included in the precursor solution for forming a buffer layer.

A method of forming a buffer layer using the precursor solution according to the present invention includes: mixing a precursor for forming a buffer layer with a solvent selected from the group consisting of alcohol liquids, ester liquids, ketones and mixtures thereof to form a precursor solution; adding a metal salt, serving as a precursor for forming a low melting point oxide, to the precursor solution; applying the precursor solution on a nickel or nickel alloy-based biaxially oriented metal substrate or a metal substrate coated with an oxide layer; and drying and heat-treating the metal substrate coated with the precursor solution to form a biaxially oriented oxide buffer layer.

In the solvent, the alcohol liquid may include at least one of water, methanol and ethanol, the ester liquid may include at least one of ethyl acetate and ethyl butyrate, and the ketone may include at least one of acetone and propanone. The concentration of the precursor for forming the buffer layer may range from 0.01 to 1 M, and preferably from 0.1 to 0.6 M.

The amount of the precursor for forming a low melting point oxide is 0.1%~30% by mol, and, preferably, 5%~10% by mol of the total amount of metal elements included in the precursor solution for forming a buffer layer.

The application of a precursor solution may be performed using any one of dip coating, slot die coating, gravure coating and ink-jet coating.

The forming of a buffer layer includes: drying the precursor solution applied on the metal substrate and then calcining the dried precursor solution at a temperature of 200~600° C. for 1 minute ~1 hour to form a precursor thin film; and crystallizing the precursor thin film and then heat-treating the crystallized precursor thin film at a temperature of 500~1000° C. for 10 minutes ~5 hours in a reductive gas atmosphere, including argon, nitrogen or the like, containing 1~20% of hydrogen, such that the precursor solution is epitaxially grown on the metal substrate.

In the heat treatment of the crystallized precursor thin film, the atmosphere gas may have 5% or less of moisture in reaction gas.

Hereinafter, the present invention will be described in more detail.

Generally, a method of forming a buffer layer through a wet chemical method may be performed using any one of a metal organic deposition method and a sol-gel method, depending on the precursor solution. In the wet chemical method, a precursor solution, which is prepared using a metal salt, such as metal carboxylate, metal nitrate or metal chlorate, or metal alkoxide, and a chelating agent, such as 2,4-pentadione, ethanolamine or amylamine, as main raw materials, is applied on a nickel or nickel alloy-based biaxially oriented metal substrate or a metal substrate coated with an oxide layer, and then the metal substrate coated with the precursor solution is dried and heat-treated to form a biaxially oriented oxide buffer layer. As the buffer layer, YSZ, $CeO_2$, $RE_2O_3$ (RE=Y, Ce, Sm, Gd, Eu . . . etc.), $RE_2M_2O_7$ (RE=Y, Ce, Sm, Gd, Eu . . . etc., M=Zr, Ti, Sn, . . . ), $AMO_3$ (A=Sr, Ba, Ca, M=Zr, Ti, Sn, . . . ) or the like may be used, and the kinds of metal element included in the precursor solution for forming a buffer layer are changed depending on the kind of buffer layer.

In the present invention, as a solvent for preparing the precursor solution for forming the buffer layer, alcohols, such as water, methanol, ethanol, etc., esters, such as ethyl acetate, ethyl butyrate, etc., ketones, such as acetone, propanone, etc., and mixtures thereof may be used. The concentration of metal element in the precursor solution may range from 0.1 M to 0.6 M, and preferably from 0.01 M to 1 M. In order to synthesize a precursor solution capable of forming a buffer layer through low-temperature heat treatment, a precursor capable of forming a low melting point oxide due to the low melting point thereof in the heat-treatment process may be added. As the precursor capable of a low melting oxide, a carboxylate or alkoxide of bismuth (Bi), boron (B), lead (Pb), gallium (Ga), lithium (Li), sodium (Na), potassium (K), cesium (Cs), or the like may be used. In particular, a carboxylate or alkoxide of metal element, which forms an oxide having a low melting point of 1200° C. or lower after pyrolysis in an oxygen atmosphere, may be used, and the kinds of precursors, which can exist in a liquid phase depending on the raw materials of a buffer layer to be formed, may also be changed. For example, bismuth carboxylate forms a bismuth oxide having a melting point of about 850° C. after pyrolysis in an oxygen atmosphere. The amount of the metal salt precursor added to form a low melting point oxide may be 0.1%~30% by mol, and preferably 5%~10% by mol of the total amount of metal elements included in the precursor solution for forming a buffer layer.

The precursor solution (buffer layer solution) prepared as above is applied on a metal substrate using various coating methods, such as dip coating, slot die coating, gravure coating, ink-jet coating, etc. The precursor solution applied on the metal substrate is dried and then calcined at a temperature of 200~600° C. for 1 minute ~1 hour. Organic matter is removed from the precursor solution applied on the metal substrate after the calcination thereof in an oxygen atmosphere, and an amorphous or nanocrystalline oxide precursor thin film is formed. The precursor thin film is crystallized through a heat treatment process, and is then epitaxially grown on the metal substrate. The heat treatment process is conducted in a reducing gas, such as argon or nitrogen, including 1~20% of hydrogen, at a temperature of 500~1000° C. for 10 minutes ~5 hours. In particular, in order to prevent the metal substrate from being oxidized, the heat treatment process must be conducted in a reducing gas. In this case, in order to completely form a buffer layer, moisture in an amount of 5% or less may be added to the reaction gas.

In this way, when the high-viscosity precursor solution, prepared by adding metal carboxylate thereto, is applied on the metal substrate and then calcined, an uncracked precursor thin film having a maximum thickness of 3 μm can be obtained. Therefore, when the precursor thin film is properly finally heat-treated, a superconducting wire rod having excellent critical current characteristics can be manufactured.

Advantageous Effects

As described above, the precursor solution according to the present invention is advantageous in that the precursor solution can be heat-treated at low temperature, compared to the precursor solution in commonly known processes, thus overcoming the problem of deterioration of the characteristics of the metal substrate and the problem occurring when a buffer layer is formed through a wet chemical method, and in that the precursor solution can be synthesized at relatively low cost, and thus it is superior in economic and industrial efficiency to conventional precursor solutions, thereby contributing greatly to the utilization of an oxide superconducting wire rod in the future.

BRIEF DESCRIPTION OF DRAWINGS

FIG. 1 is a sectional view of an oxide superconducting wire rod;
FIG. 2 is an X-ray diffraction (XRD) diagram of a $CeO_2$ buffer layer;
FIG. 3 is a photograph showing the surface of the $CeO_2$ buffer layer;
FIG. 4 is an X-ray diffraction (XRD) diagram of a $La_2Zr_2O_7$ buffer layer; and
FIG. 5 is a photograph showing the surface of the $La_2Zr_2O_7$ buffer layer.

BEST MODE FOR CARRYING OUT THE INVENTION

Example 1

A precursor solution was prepared based on the following composition.
Precursor: cerium acetylacetonate
Additive for forming a low melting point oxide: bismuth acetate
Solvent: methanol, triethanolamine
The concentration of the prepared precursor solution to metal ions was controlled at 0.5 M. The prepared precursor solution was applied on a silver-nickel-tungsten alloy substrate through slot die coating, and was then calcined in air to form a precursor thin film. The surface of the precursor thin film, formed after the calcination thereof, was uniform and was not cracked. The precursor thin film formed after the calcination thereof was finally heat-treated at a temperature of 850 C in an atmosphere of mixed gas of $N_2/H_2$ (4%), thereby forming a $CeO_2$ buffer layer.
FIG. 2 is an X-ray diffraction (XRD) diagram of the $CeO_2$ buffer layer according to Example 1, and FIG. 3 is a photograph showing the surface of the $CeO_2$ buffer layer according to Example 1.
As shown in FIGS. 2 and 3, it was found that, as the amount of bismuth added was increased, the strength of $CeO_2$ (002) peaks, which designate (001) orientations, was increased, and, when 10% bismuth was added thereto, $CeO_2$ (111) peaks were not observed, and only $CeO_2$ (002) peaks were observed.
Specifically, as the result of measuring a θ-rocking curve in order to evaluate the c-axis orientation degree of (001) plane of the formed buffer layer, the half-value width of the peak was found to be 9°. Further, as the result of measuring $CeO_2$ (111) φ-scan in order to evaluate the biaxial texturing of a $CeO_2$ buffer layer, the half-value width in the $CeO_2$ buffer layer was found to be 9° in the φ-scan, measured at a ψ angle of 54.7°. Further, as the result of measuring X-ray diffraction (XRD) pattern, the degree of orientation of $CeO_2$ buffer layer was found to be high. Furthermore, as the result of analysis of the surface of the buffer layer using a scanning electron microscope, it can be seen that the buffer layer includes uniform crystal grains having a size of about 40 nm, and it was found that densified microstructures were observed.

Example 2

A precursor solution was prepared based on the following composition.
Precursor: lanthanum nitrate, zirconium propoxide
Additive for forming a low melting point oxide: bismuth acetate
Solvent: methanol
The prepared precursor solution was applied on a nickel-tungsten alloy substrate through slot die coating, and was then calcined in air to form a precursor thin film. The surface of the precursor thin film, formed after the calcination thereof, was uniform and was not cracked. The precursor thin film formed after the calcination thereof was finally heat-treated at a temperature of 850° C. in an atmosphere of mixed gas of $N_2/H_2$ (4%), thereby forming a $La_2Zr_2O_7$ buffer layer.
FIG. 4 is an X-ray diffraction (XRD) diagram of the $La_2Zr_2O_7$ buffer layer according to Example 2, and FIG. 5 is a photograph showing the surface of the $La_2Zr_2O_7$ buffer layer according to Example 2.
As the result of measurement of the θ-rocking curve in order to evaluate the c-axis orientation degree of (001) plane of the formed buffer layer, the half-value width of the peak was found to be 5.7°. Further, as the result of a $La_2Zr_2O_7$ (111) φ-scan in order to evaluate the biaxial texturing of a $La_2Zr_2O_7$ buffer layer, the half-value width in the $La_2Zr_2O_7$ buffer layer was found to be 8.5° in the φ-scan, measured at a ψ angle of 54.7°. Further, as the result of X-ray diffraction (XRD) analysis, the degree of orientation of the $La_2Zr_2O_7$ buffer layer was found to be high. Furthermore, as the result of analysis of the surface of the buffer layer using a scanning electron microscope, it can be seen that the buffer layer includes uniform crystal grains having a size of about 100 nm, and densified microstructures were observed.
A better understanding of the present invention may be obtained through the above examples, which are set forth to illustrate, but are not to be construed as the limit of the present invention.

INDUSTRIAL APPLICABILITY

As described above, the precursor solution according to the present invention is advantageous in that the precursor solution can be easily formed into a buffer layer at low cost through a wet chemical method, and thus it is superior in economic and industrial efficiency to conventional precursor solutions, thereby contributing greatly to the utilization of an oxide superconducting wire rod in the future.

The invention claimed is:
1. A precursor solution for forming a biaxially oriented buffer layer through low-temperature heat treatment, which comprises:
a precursor for forming a buffer layer of YSZ, $CeO_2$, $RE_2O_3$(RE=Y, Ce, Sm, Gd or Eu), $RE_2M_2O_7$ (RE=Y, Ce, Sm, Gd or E, M=Zr, Ti or Sn), $AMO_3$(A=Sr, Ba or Ca, M=Zr, Ti or Sn);
a solvent selected from the group consisting of alcohol liquids, ester liquids, ketones and mixtures thereof; and
a metal salt precursor for forming a low melting point oxide selected from among the metal salt of bismuth (Bi), boron (B), lead (Pb), gallium (Ga), lithium (Li), sodium (Na), potassium (K), and cesium (Cs) in an amount of

0.1% ~30% by mol of a total amount of metal elements included in the precursor solution.

2. The precursor solution according to claim 1, wherein the precursor for forming a buffer layer has a concentration of 0.01~1.0 M.

3. The precursor solution according to claim 1, wherein the precursor for forming a buffer layer has a concentration of 0.1~0.6 M.

* * * * *